United States Patent
Liu et al.

(10) Patent No.: US 9,698,774 B2
(45) Date of Patent: Jul. 4, 2017

(54) 20V TO 50V HIGH CURRENT ASIC PIN DIODE DRIVER

(71) Applicant: MACOM Technology Solutions Holdings, Inc., Lowell, MA (US)

(72) Inventors: Chengxin Liu, Bedford, MA (US); Christopher D. Weigand, Andover, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/880,457

(22) Filed: Oct. 12, 2015

(65) Prior Publication Data

US 2017/0047927 A1   Feb. 16, 2017

Related U.S. Application Data

(60) Provisional application No. 62/234,806, filed on Sep. 30, 2015, provisional application No. 62/205,217, filed on Aug. 14, 2015.

(51) Int. Cl.
 *H03K 3/00*    (2006.01)
 *H03K 17/74*   (2006.01)
 *H03K 17/687*  (2006.01)

(52) U.S. Cl.
 CPC ......... *H03K 17/74* (2013.01); *H03K 17/687* (2013.01)

(58) Field of Classification Search
 None
 See application file for complete search history.

(56) References Cited

U.S. PATENT DOCUMENTS

| | | | |
|---|---|---|---|
| 3,546,484 A * | 12/1970 | Fowler | H03K 5/02 326/30 |
| 5,144,157 A | 9/1992 | Russell et al. | 307/270 |
| 7,710,152 B1 * | 5/2010 | El Bacha | H03K 3/356113 326/68 |

(Continued)

OTHER PUBLICATIONS

Shairi, N. A., et al., "Design and Analysis of Broadband High Isolation of Discrete Packaged PIN Diode SPDT Switch for Wireless Data Communication", RF and Microwave Conference (RFM), 2011 IEEE International IEEE, Dec. 12, 2011, pp. 91-94.

(Continued)

*Primary Examiner* — Lincoln Donovan
*Assistant Examiner* — Khareem E Almo
(74) *Attorney, Agent, or Firm* — Christopher P. Maiorana, PC

(57) ABSTRACT

An apparatus having a first circuit, a second circuit and a third circuit is disclosed. The first circuit may be configured to translate an input signal in a first voltage domain to generate a complementary pair of first signals in a second voltage domain. The second circuit may be configured to logically switch the first signals to generate a complementary pair of second signals in the second voltage domain. The first signals may be logically switched such that both of the second signals are inactive before one of the second signals transitions from inactive to active. The third circuit may be configured to amplify the second signals to generate a complementary pair of output signals in the second voltage domain. Each of the output signals generally has a current capacity to drive one or more of a plurality of diodes in a diode switch circuit.

19 Claims, 8 Drawing Sheets

(56) References Cited

U.S. PATENT DOCUMENTS

| | | | |
|---|---|---|---|
| 8,933,727 B1 | 1/2015 | Liu et al. .................. | 326/82 |
| 9,048,840 B2* | 6/2015 | Liu .................. | H03K 17/74 |
| 9,356,443 B2* | 5/2016 | Yang .................. | H02H 9/046 |
| 2006/0169909 A1 | 8/2006 | Oka .................. | 250/372 |
| 2006/0255835 A1* | 11/2006 | Cordoba ............ | H03K 3/35613 |
| | | | 326/68 |
| 2007/0216443 A1* | 9/2007 | Ryan ............... | H03K 19/01852 |
| | | | 326/81 |
| 2011/0187431 A1* | 8/2011 | Bhattacharya ... | H03K 3/356113 |
| | | | 327/210 |
| 2012/0176177 A1* | 7/2012 | Phillips ............... | H03K 17/163 |
| | | | 327/399 |
| 2012/0212256 A1* | 8/2012 | Nicholas .......... | H03K 19/01852 |
| | | | 326/80 |
| 2013/0049818 A1* | 2/2013 | Liu et .................... | H03K 17/76 |
| | | | 327/109 |

OTHER PUBLICATIONS

"The Pin Diode Circuit Designers' Handbook", Jan. 1, 1998, Retrieved from the Internet: URL:http://www.ieee.li/pdf/pin_diode_handbook.pdf, 134 pages.

\* cited by examiner

20V TO 50V HIGH CURRENT ASIC PIN DIODE DRIVER

This application relates to U.S. Provisional Application No. 62/234,806, filed Sep. 30, 2015, U.S. Provisional Application No. 62/205,217, filed Aug. 14, 2015, and U.S. Pat. No. 9,048,840, each of which are hereby incorporated by reference in their entirety.

FIELD OF THE INVENTION

The present invention relates to current drivers generally and, more particularly, to a method and/or apparatus for implementing 20V to 50V high current ASIC PIN diode driver.

BACKGROUND OF THE INVENTION

Currently, no fully integrated high voltage p-intrinsic-n (i.e., PIN) diode drivers exist that are capable to both sink and source high currents. High-power wide-band series-shunt PIN diode switches are specified to have low insertion loss to improve efficiency and power handling in a transmission path, and minimize a noise figure in a receive path. The PIN diode drivers supply bias currents to series PIN diodes and sink currents into an output buffer.

Shunt diodes are widely used in the PIN diode switches to improve isolation. For the wide-band switches, working down to several hundreds of megahertz, a DC blocking capacitor between the receive series diode and the shunt diode is not practical because of the physical size. Without the DC blocking capacitor, the back bias voltage used to turn off the receive series diode also directly biases the receive shunt diode in an on-state. For high-power lower-frequency applications, the back voltage can be as high as 50 volts. A high voltage power supply of the PIN diode driver provides the high currents.

To achieve the high sinking/sourcing current criteria for a high voltage PIN diode driver, a typical solution is to use discrete power metal-oxide-silicon field effect transistors (i.e., MOSFETs) as an output buffer, due to high current ratings, and a discrete or integrated gate driver to level-shift digital input controls. A large current limiting resistor with a high power rating is added between the high-side MOSFET and the output to protect the MOSFETs from high transient currents when switching states. The conventional solutions take significant printed circuit board area and are slow in terms of switching speed, typically longer than 1 microsecond.

Conventional full-bridge or half-bridge gate driver integrated circuits are sufficiently fast enough to drive the high power discrete MOSFETs. The conventional drivers have problems driving the PIN diode switches. The drivers include bootstrap capacitors in charge pumps to fully shut down the high side MOSFET. However, the charge in the bootstrap capacitor will discharge over time, thereby preventing the PIN diodes from being in the off-state for a sustained period.

It would be desirable to implement a 20V to 50V high current ASIC PIN diode driver.

SUMMARY OF THE INVENTION

The present invention concerns an apparatus having a first circuit, a second circuit and a third circuit. The first circuit may be configured to translate an input signal in a first voltage domain to generate a complementary pair of first signals in a second voltage domain. The second circuit may be configured to logically switch the first signals to generate a complementary pair of second signals in the second voltage domain. The first signals may be logically switched such that both of the second signals are inactive before one of the second signals transitions from inactive to active. The third circuit may be configured to amplify the second signals to generate a complementary pair of output signals in the second voltage domain. Each of the output signals generally has a current capacity to drive one or more of a plurality of diodes in a diode switch circuit.

The objects, features and advantages of the present invention include providing a 20 volts (e.g., V) to 50 volts high current application specific integrated circuit (e.g., ASIC) p-intrinsic-N (e.g., PIN) diode driver that may (i) be fully integrated, (ii) achieve a desired current capability without external power MOSFETs, (iii) provide 200-milliampere sinking current for a series diode and 100-milliampere sourcing current for a shunt diode, (iv) drive a typical series/shunt single-pole-double-throw PIN diode switch, (v) be extended to drive switches of any number of poles and throws, (vi) be extended to drive absorptive and/or reflective switches, (vii) be extended to higher voltages as higher voltage processes become available, (viii) include an integrated voltage translator that responds to regular control logic, (ix) be compatible with 3 volt or 5 volt logic, (x) allow a wide back bias voltage range (e.g., from 20 volts to 50 volts), (xi) provide temperature compensation to minimize PIN diode bias current variations over temperature and over the back bias voltage range, (xii) have low quiescent power consumption (e.g., as low as 1 milliampere for 50-volt operation), (xiii) provide fast switching speeds (e.g., less than 300 nanoseconds) and/or (xiv) be implemented as a single integrated circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Various embodiments of the present invention generally provide a fully integrated diode driver to drive high power wide band p-intrinsic-n (e.g., PIN) diode switches in a compact package (e.g., a 3-millimeter 16-lead quad flat no-leads package). The diode driver may be capable of sinking large currents and sourcing large currents. The diode driver may also provide high voltage back bias to create suitable isolation among the PIN diodes in high power applications.

Figure 1:
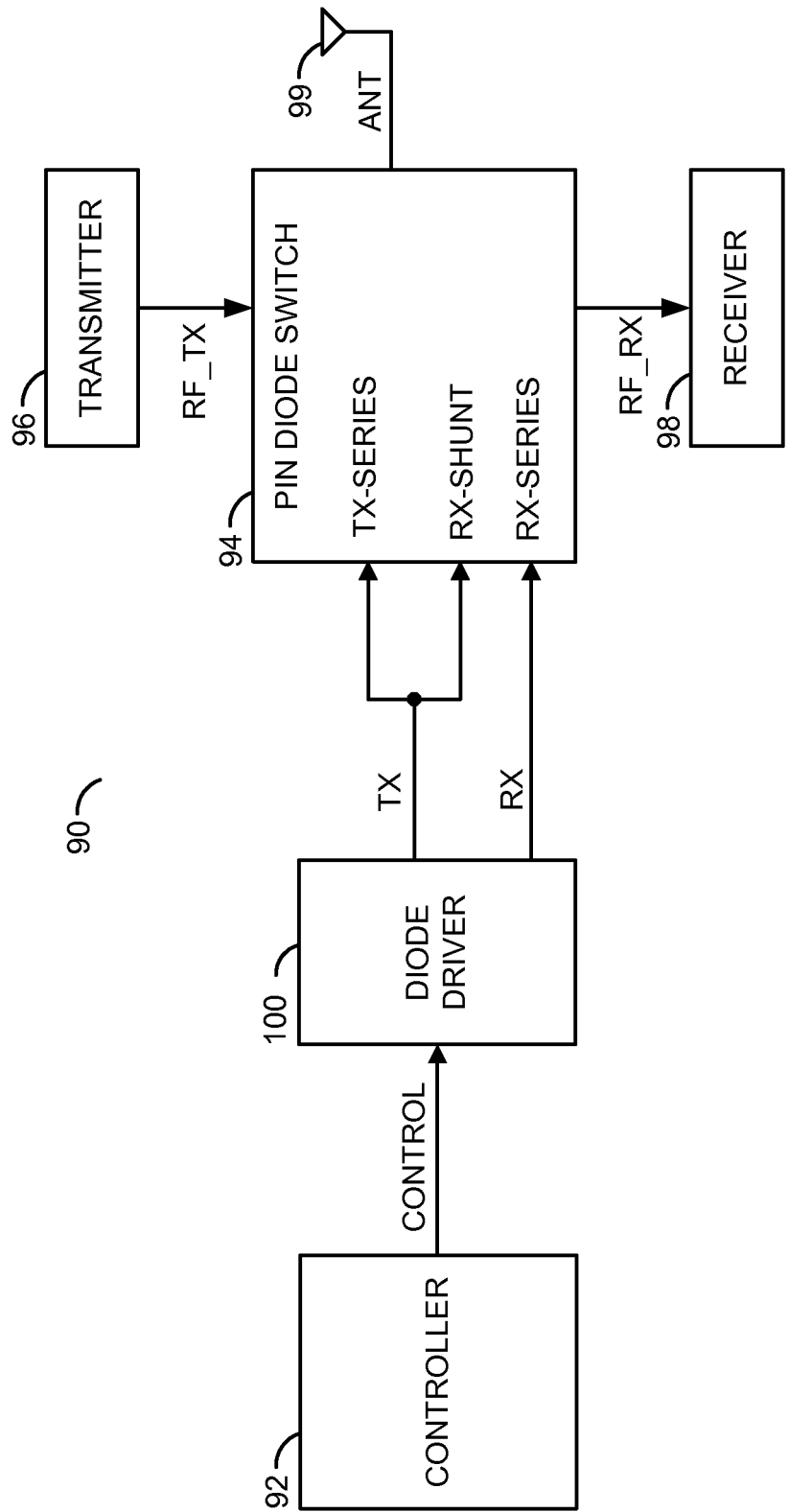
FIG. 1 is a block diagram of a system.

Referring to FIG. 1, a block diagram of a system 90 is shown. The system (or apparatus) 90 generally comprises a block (or circuit) 92, a block (or circuit) 94, a block (or circuit) 96, a block (or circuit) 98, a block (or circuit) 99 and a block (or circuit) 100. The circuits 92-100 may be implemented with hardware and/or simulated with software.

The circuit 92 may generate a control signal (e.g., CONTROL) received by circuit 100. The circuit 100 may generate a signal (e.g., TX) received by the circuit 94. A signal (e.g., RX) may be generated by the circuit 100 and presented to the circuit 94. A transmit signal (e.g., RF_TX) may be generated by the circuit 96 and presented to the circuit 94. A receive signal (e.g., RF_RX) may be presented by the circuit 94 to the circuit 98. A bidirectional signal (e.g., ANT) may be exchanged between the circuit 94 and the circuit 99.

The circuit 92 may implement a controller circuit. The circuit 92 is generally operational to control a mode of the circuit 94. The circuit 92 may generate the signal CONTROL in a transmit state to command the circuit 94 into a transmit mode. The signal CONTROL may be generated in a receive state to command the circuit 94 into a receive mode.

The circuit 94 may implement a diode switch circuit. The circuit 94 is generally operational to switch the high-frequency signals RF_TX, RF_RX and ANT through multiple diodes in either the transmit mode or the receive mode as determined by the signals TX and RX. In various embodiments, the signal TX may be received at multiple inputs (e.g., TX-SERIES and RX-SHUNT). The signal RX may be received at an input (e.g., RX-SERIES). In some embodiments, the diodes may be implemented as PIN diodes and the circuit 94 may be implemented as a PIN diode switch circuit. Other types of diodes may be implemented to meet the design criteria of a particular application.

The circuit 96 may implement a transmitter circuit. The circuit 96 is generally operational to generate data in the transmission signal RF_TX while the system 90 is in the transmit mode.

The circuit 98 may implement a receiver circuit. The circuit 98 is generally operational to receive data in the receive signal RF_RX while the system 90 is in the receiving mode.

The circuit 99 may implement an antenna circuit. While transmitting, the circuit 99 is generally operational to broadcast transmit data generated by the circuit 96, switched by the circuit 94 and received in the signal ANT. While receiving, the circuit 99 is generally operational to accept receive data, and present the receive data in the signal ANT to the circuit 94 for switching to the circuit 98.

The circuit 100 may implement a diode driver circuit. The circuit 100 is generally operational to source current to and sink current from diodes in the circuit 94 in response to the signal CONTROL. In various embodiments, the circuit 100 may be designed to accommodate one or more diodes. Control of the diodes may be achieved by generating the signals TX and RX.

The circuit 100 may operate in one of multiple modes (e.g., the transmit mode and the receive mode) at a time as determined by the signal CONTROL. In the transmit mode, the circuit 100 may assert the driver signals TX and RX such that the signal RF_TX is switched (or routed) to the signal ANT in the circuit 94 and the signal RF_RX is switched (or routed) to a signal ground (or termination). In the receive mode, the circuit 100 may assert the driver signals TX and RX such that the signal ANT is switched (or routed) to the signal RF_RX and the signal RF_TX is switched (or routed) to the signal ground (or termination).

Figure 2:
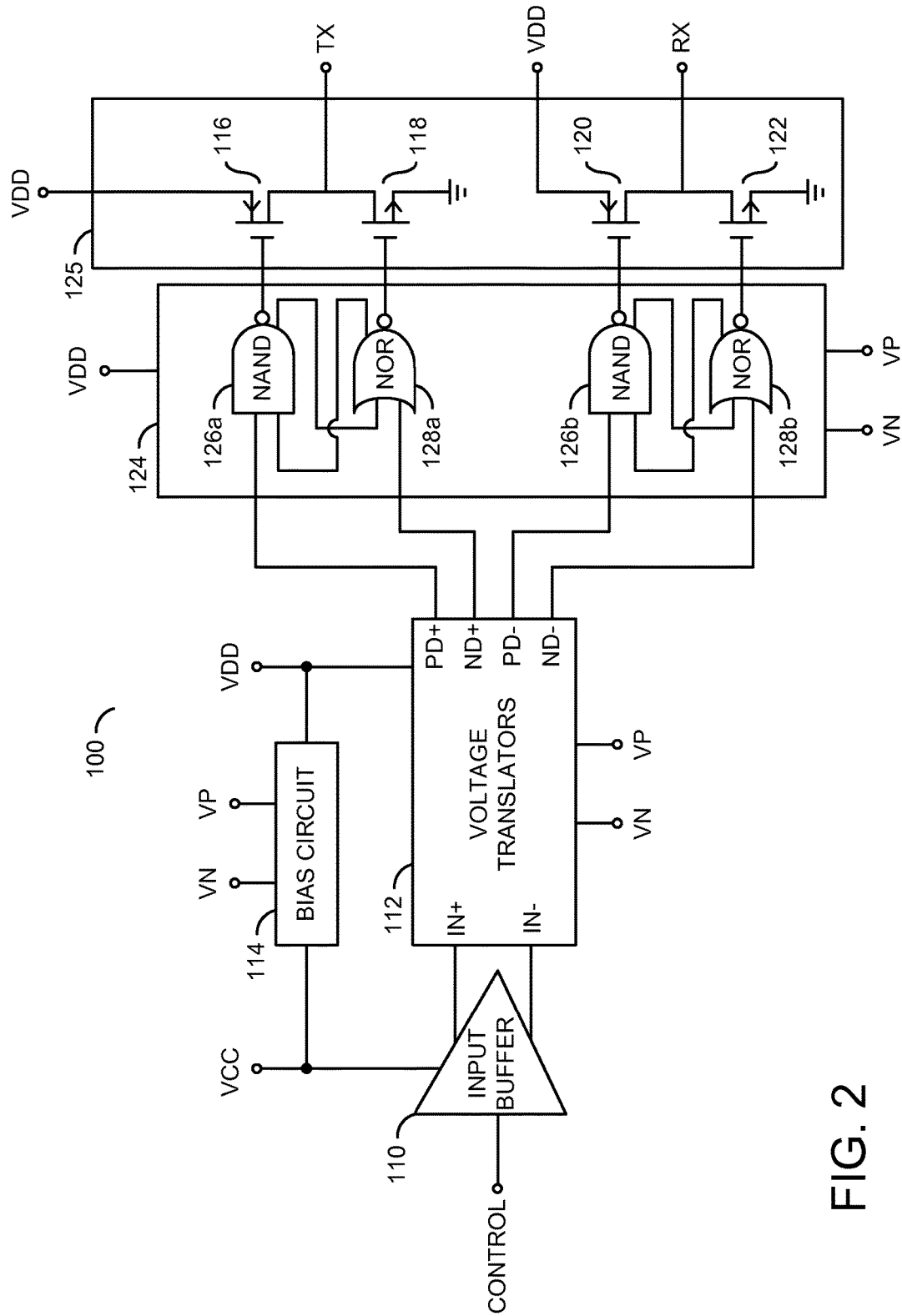
FIG. 2 is a block diagram of a diode driver circuit in accordance with a preferred embodiment of the present invention.

Referring to FIG. 2, a block diagram of a circuit 100 is shown in accordance with a preferred embodiment of the present invention. The circuit (or apparatus) 100 generally comprises a block (or circuit) 110, a block (or circuit) 112, a block (or circuit) 114, a block (or circuit) 124 and a block (or circuit) 125. The circuit 124 generally comprises multiple blocks (or circuits) 126a-126b and multiple blocks (or circuits) 128a-128b. The circuit 125 generally comprises a device (or circuit) 116, a device (or circuit) 118, a device (or circuit) 120 and a device (or circuit) 122. The circuits 110-128b may be implemented with hardware and/or simulated with software. Additional details for the circuit 100 may be found in U.S. Pat. No. 9,048,840, which is hereby incorporated by reference in its entirety.

The signal CONTROL may be received by the circuit 110. A complementary pair of input signals (e.g., IN+ and IN−) may be generated by the circuit 110 and transferred to the circuit 112. The circuit 112 may generate a complementary pair of output signals (e.g., PD+ and PD−) that are received by the circuit 124. The circuit 112 may generate another complementary pair of output signals (e.g., ND+ and ND−) that are received by the circuit 124. A bias signal (e.g., VN) may be generated by the circuit 114 and received by the circuits 112 and 124. A bias signal (e.g., VP) may be generated by the circuit 114 and received by the circuits 112 and 124. The signal TX may be generated and presented by the devices 116 and 118. The signal RX may be generated and presented by the devices 120 and 122. A power supply signal (e.g., VCC) in a low voltage domain (e.g., 3 volts to 5 volts) may be received by the circuits 110 and 114. Another power supply signal (e.g., VDD) in a high voltage domain (e.g., 20 volts to 50 volts) may be received by the circuits 112, 114, 124 and 125. In various embodiments, the power supply signal VDD may be greater than 50 volts (e.g., up to 250 volts) to meet the design criteria of a particular application.

The circuit 110 may implement an input buffer circuit. The circuit 110 is generally operational to square up the signal CONTROL (e.g., a single-ended 3 volt or 5 volt logic control signal) and generates complementary output signals IN+ and IN− to drive the circuit 112.

The circuit 112 may implement a high voltage translator circuit. The circuit 112 is generally operational to translate the signals IN+ and IN− from the power supply signal VCC voltage domain to the signals PD+, PD−, ND+ and ND− in the power supply signal VDD voltage domain.

The circuit 114 may implement a bias circuit. The circuit 114 is generally operational to generate several bias voltages (e.g., in the signals VN and VP) and several bias currents used inside the circuit 100. A bandgap reference circuit in the circuit 114 generally provides temperature compensation for the circuit 100.

The circuits 116, 118, 120 and 122 may implement high current and high voltage power transistors. In various embodiments, each transistor 116-120 may be a power metal-oxide-semiconductor field effect transistor (e.g., MOSFET). The transistors 116 and 118 may form a complementary pair. The transistors 120 and 122 may form another complementary pair.

The transistors 118 and 122 may implement high voltage (e.g., 50 volt or higher) power n-channel MOSFETs. The transistors 118 and 122 generally have a low (e.g., less than 10 ohms) on resistance. The transistors 116 and 120 may implement high voltage (e.g., 50 volt or higher) power p-channel MOSFETs. The transistors 116 and 120 generally have a low (e.g., less than 30 ohms) on resistance.

The circuit 124 may implement a logic switch circuit. The circuit 124 is generally operational as a pre-driver for the transistors 116-122 in the circuit 125. The circuit 124 may also be operational to make sure that both the output pull-up transistors and pull-down transistors 116-120 may be inactive (or non-conductive or shut down) before the signals TX and/or RX change active states. Before a transition of the signal TX, the circuit 124 may drive the gates of the transistors 116 and 118 to respective inactive conditions so that both transistors 116 and 118 begin the transition in the inactive (or non-conductive or shut down) state. Before a transition of the signal RX, the circuit 124 may drive the gates of the transistors 120 and 122 to respective inactive conditions so that both transistors 120 and 122 begin the transition in the inactive (or non-conductive or shut down) state.

The circuit 125 may implement a driver circuit. The circuit 125 is generally operational to generate multiple (e.g., two) output signals (e.g., the signal TX and the signal RX) by amplifying intermediate signals received from the circuit 124. The transistors 116-122 of the circuit 125 may provide large sinking currents (e.g., up to 200 milliamperes) and large sourcing currents (e.g., up to 100 milliamperes) to drive the PIN diodes in the circuit 94. In various embodiments, the circuit 125 may sink currents greater than 200 milliamperes (e.g., up to 1000 milliamperes) and/or source currents greater than 100 milliamperes (e.g., up to 500 milliamperes) to meet the design criteria of a particular application.

Each circuit 126a-126b may implement a logical NAND gate. The circuit 126a may receive the signal PD+ from the circuit 112 and a feedback signal from the circuit 128a. The transistor 116 may be controlled by the intermediate (or output) signal generated by the circuit 126a. The circuit 126b may receive the signal PD− from the circuit 112 and a feedback signal from the circuit 128b. The transistor 120 may be controlled by the intermediate (or output) signal generated by the circuit 126b.

Each circuit 128a-128b may implement a logical NOR gate. The circuit 128a may receive the signal ND+ from the circuit 112 and a feedback signal from the circuit 126a. The transistors 118 may be controlled by the intermediate (or output) signal generated by the circuit 128a. The circuit 128b may receive the signal ND− from the circuit 112 and a feedback signal from the circuit 126b. The transistor 122 may be controlled by the intermediate (or output) signal generated by the circuit 128b.

If the transistor pair 116 and 118 and/or the transistor pair 120 and 122 are not shut down before changing states, the high voltage supply signal VDD may see a low resistance path during the transitions of the transistors. The circuits 126a and 128a may be configured to prevent both the transistors 116 and 118 from being active (or conductive) simultaneously while the signal TX transitions from a high state and a low state and from the low state to the high state. The circuits 126b and 128b may be configured to prevent both the transistors 120 and 122 from being active (or conductive) simultaneously while the signal RX transitions from a high state and a low state and from the low state to the high state.

Figure 3:
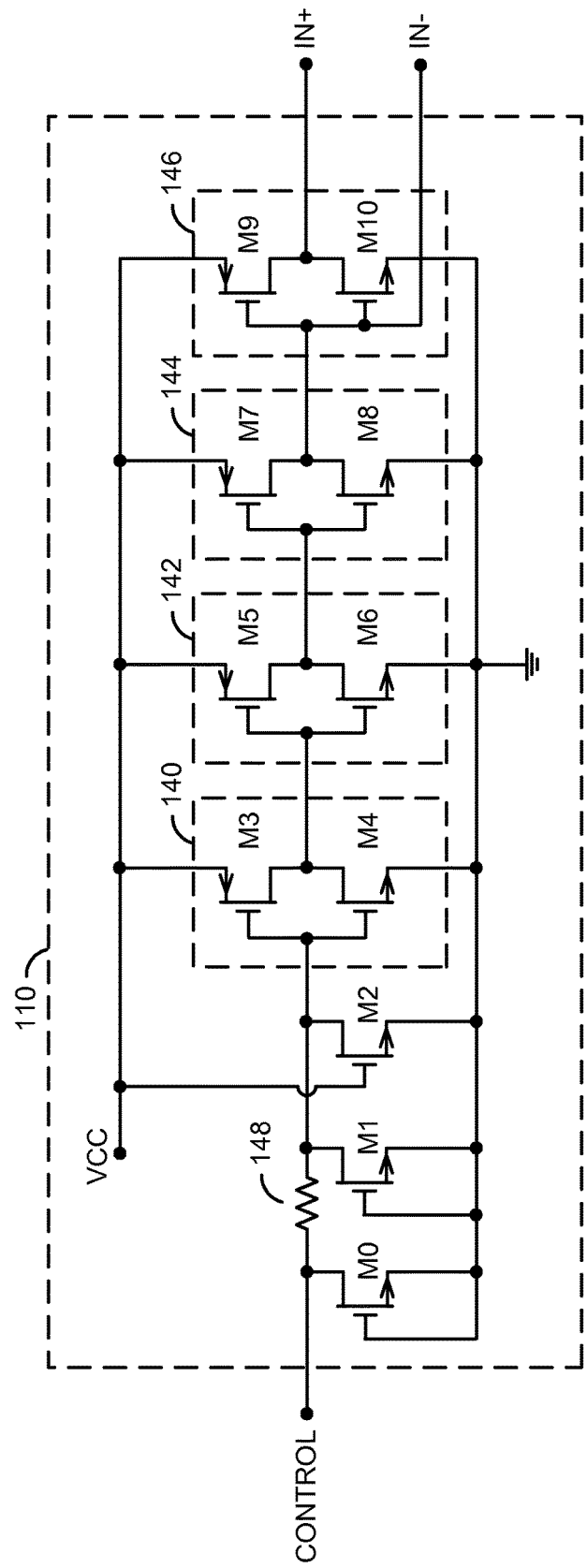
FIG. 3 is a schematic diagram of an input buffer circuit.

Referring to FIG. 3, a schematic diagram of an example implementation of the circuit 110 is shown. The circuit 110 generally comprises a block (or circuit) 140, a block (or circuit) 142, a block (or circuit) 144, a block (or circuit) 146 and a device (or circuit) 148. The circuits 140-148 may be implemented with hardware and/or simulated with software.

In the example, the circuit 110 may comprise a number of MOSFETs (e.g., M0 to M10). The MOSFETS M0 and M1 may have respective gates, drains and sources connected such that the MOSFETS M0 and M1 and the device (e.g., a resistor) 148 function as an electrostatic discharge (e.g., ESD) protection circuit. A gate of the MOSFET M2 may be connected to power supply signal VCC. The MOSFET M2 may actively pull down the signal CONTROL to ground potential. The pull down generally prevents the signal CONTROL from floating while not actively being driven by the circuit 92.

The MOSFETs M3 and M4 may be connected to form a complementary metal oxide semiconductor (e.g., CMOS) inverter 140. The MOSFETs M5 and M6 may be connected to form a CMOS inverter 142. The MOSFETs M7 and M8 may be connected to form a CMOS inverter 144. The MOSFETs M9 and M10 may be connected to form a CMOS inverter 146. The CMOS invertors 140, 142, 144 and 146 may be connected between the power supply signal VCC and ground potential. The input signal CONTROL may be presented to a drain of the MOSFET M0 and a first terminal of the resistor 148. A second terminal of the resistor 148 may be connected to a drain of the MOSFET M1, a drain of the MOSFET M2 and an input of the CMOS inverter 140. An output of the inverter 140 may be connected to an input of the inverter 142. An output of the inverter 142 may be presented to an input of the inverter 144. An output of the inverter 144 may be presented to an input of the inverter 146. An output of the inverter 146 may present the signal IN+. The output of the inverter 144 may present the complementary signal IN−.

Figure 4:
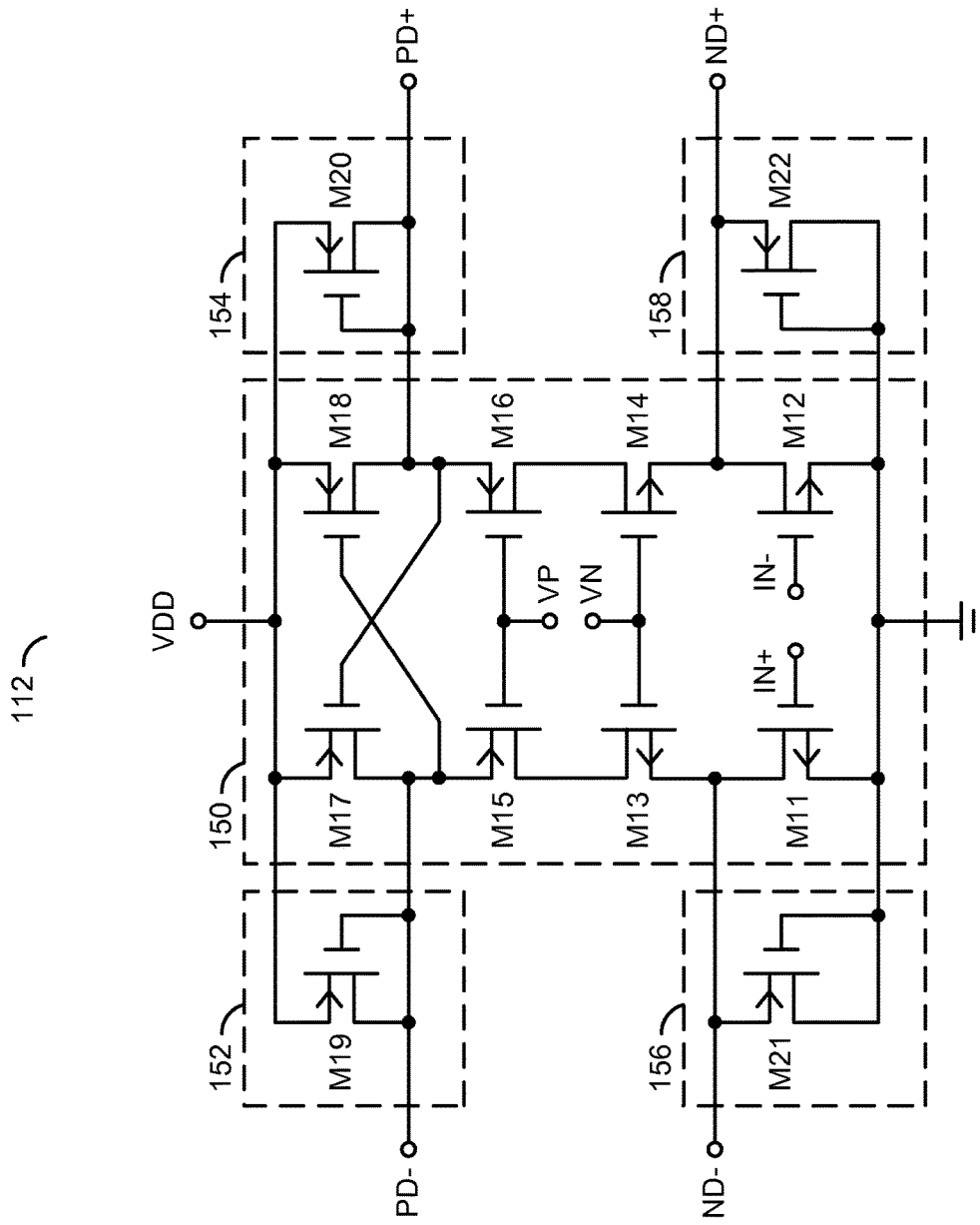
FIG. 4 is a schematic diagram of a voltage translator circuit.

Referring to FIG. 4, a schematic diagram of an example implementation of the circuit 112 is shown. The circuit 112 generally comprises a block (or circuit) 150, a block (or circuit) 152, a block (or circuit) 154, a block (or circuit) 156 and a block (or circuit) 158. The circuits 150-158 may be implemented with hardware and/or simulated with software.

The circuit 150 may implement an a voltage translator circuit. Each circuit 152, 154, 156 and 158 may implement protection circuitry. In the example, the circuit 112 may comprise a number of MOSFETs (e.g., M11 to M22). The MOSFETS M11 to M18 may form the voltage translator circuit 150 in a high voltage driver. The MOSFETS M13 to M16 may implement high voltage (e.g., 50 volt or higher) MOSFETS for high voltage operation. A bias voltage in the signal VP may be received by the MOSFETS M15 and M16. The bias voltage in the signal VP may be within a specified high voltage (e.g., 20 volts) of the power supply signal VDD to protect the MOSFETS M17 and M18 (e.g., 20 volt field effect transistors). A bias voltage in the signal VN may be received by the MOSFETs M13 and M14. The bias voltage in the signal VN is generally below a specified low voltage (e.g., 20 volts) relative to ground to protect the MOSFETS M11 and M12 (e.g., 20 volt field effect transistors). The MOSFETS M19 to M22 in the circuits 152 to 156, respectively, may implement protection MOSFETs to hold the voltage for gate drive output signals PD+, PD−, ND+, and ND− through small leakage currents.

Figure 5:
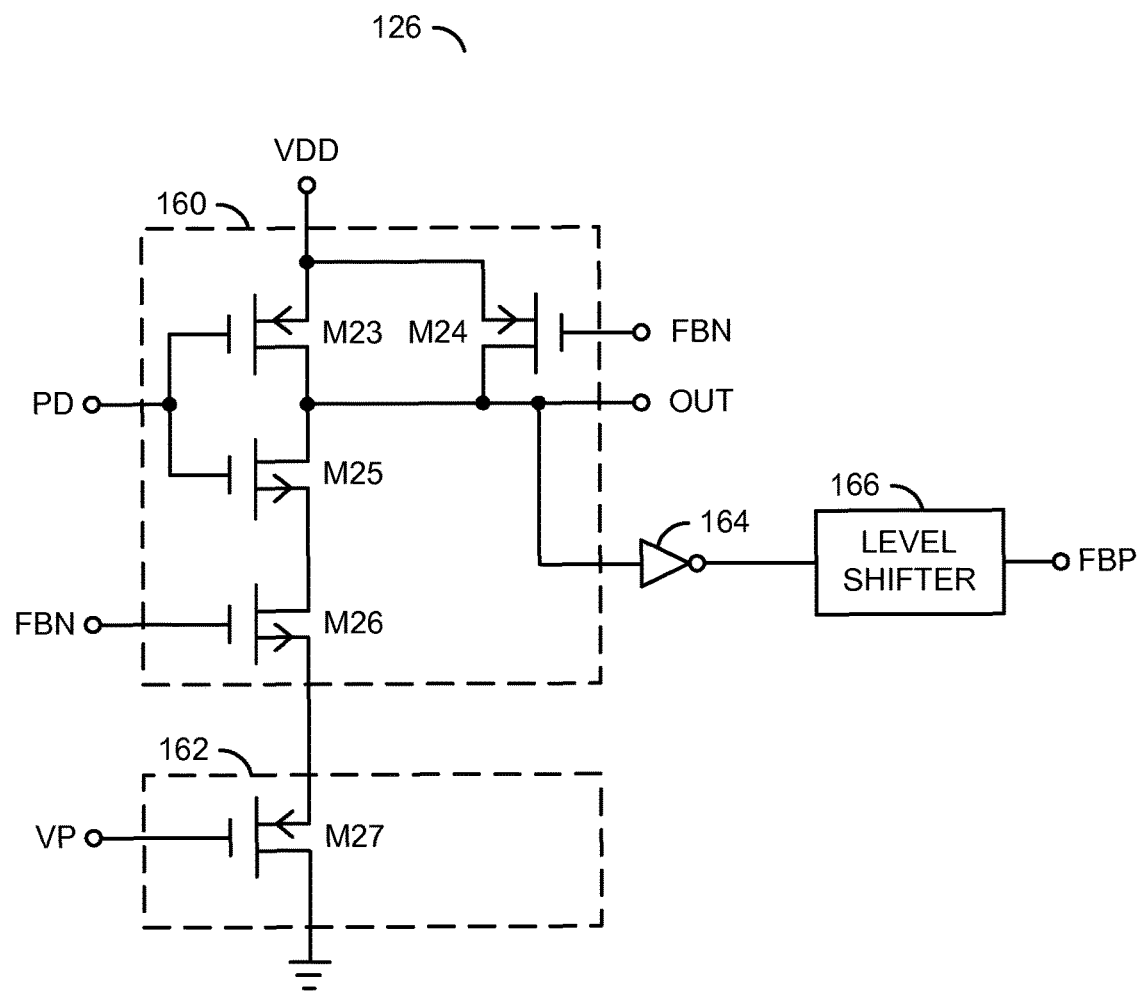
FIG. 5 is a schematic diagram of a NAND gate.

Referring to FIG. 5, a schematic diagram of an example implementation of a circuit 126 is shown. The circuit 126 may represent the circuits 126a and 126b. The circuit 126 generally comprises a block (or circuit) 160, a block (or circuit) 162, a block (or circuit) 164 and a block (or circuit) 166. The circuits 160-166 may be implemented with hardware and/or simulated with software.

The circuit 160 may implement a logical NAND gate. The circuit 162 may implement a clamp circuit. The circuit 164 may implement an inverter circuit. The circuit 166 may implement a level shifter circuit. In the example, the circuit 126 may comprise a number of MOSFETs (e.g., M23 to M27).

The MOSFETS M23 to M26 of the circuit 160 may be configured to perform the logical NAND function. The signal PD (e.g., PD+ or PD−) and a signal (e.g., FBN from the circuit 128, see FIG. 6) may be received by the circuit 126. An output signal (e.g., OUT) may be the logical NAND of the signals PD and FBN. A feedback signal (e.g., FBP) may be generated by inverting with the circuit 164 and level shifting with the circuit 166 to generate the signal OUT.

The MOSFET M27 of the circuit 162 may receive a clamping voltage (e.g., VP) at a gate node from the circuit 114. The MOSFET M27 generally clamps the signal OUT to be within a specified voltage (e.g., 15 volts) from the power rails. The clamping generally protects the gates of the output power MOSFETs 116 and 120 (FIG. 2). Even though the drain-to-source breakdown voltage of the MOSFETS 116 and 120 may be high (e.g., above 50 volts), the gate-to-source breakdown voltage may be lower (e.g., only 20 volts). The level shifted signal FBP may be a feedback signal to make sure both output power MOSFETs in each pair of power MOSFETS may be shut down before changing states.

Figure 6:
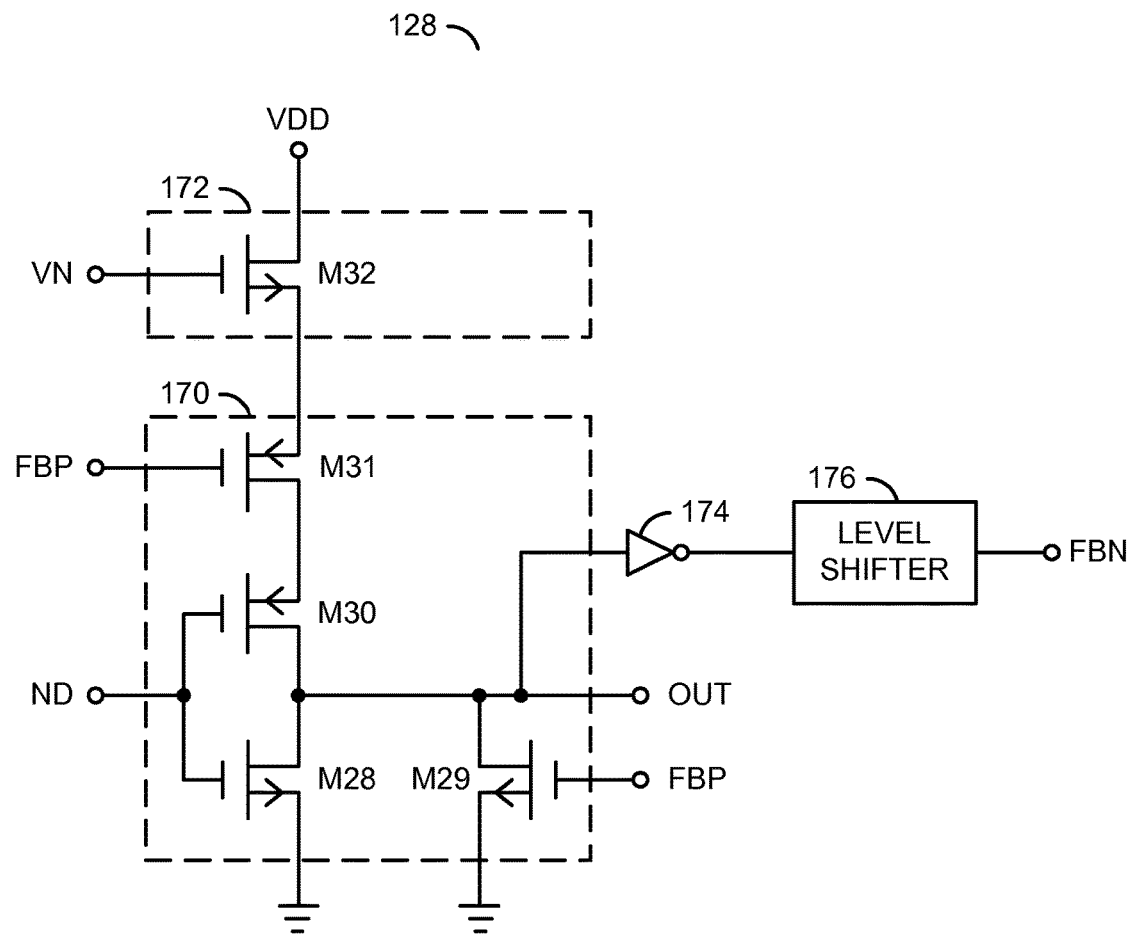
FIG. 6 is a schematic diagram of a NOR gate.

Referring to FIG. 6, a schematic diagram of an example implementation of a circuit 128 is shown. The circuit 128 may represent the circuits 128a and 128b. The circuit 128 generally comprises a block (or circuit) 170, a block (or circuit) 172, a block (or circuit) 174 and a block (or circuit) 176. The circuits 170-176 may be implemented with hardware and/or simulated with software.

The circuit 170 may implement a logical NOR gate. The circuit 172 may implement a clamp circuit. The circuit 174 may implement an inverter circuit. The circuit 176 may implement a level shifter circuit. In the example, the circuit 128 may comprise a number of MOSFETs (e.g., M28 to M32).

The MOSFETS M28 to M31 of the circuit 170 may be configured to perform a logical NOR function. The signal ND (e.g., ND+ or ND−) and the signal FBP (from the circuit 126) may be received by the circuit 128. An output signal (e.g., OUT) may be the logical NOR of the signals ND and FBP. The feedback signal FBP may be generated by inverting in the circuit 174 and level shifting in the circuit 176 to generate the signal OUT.

The MOSFET M32 of the circuit 172 may receive a clamping voltage (e.g., VN) at a gate node from the circuit 114. The MOSFET M32 generally clamps the signal OUT to be within a specified voltage (e.g., 15 volts) from the power rails. The clamping generally protects the gates of the output power MOSFETs 118 and 122 (FIG. 2). Even though the drain-to-source breakdown voltage of the MOSFETS 118 and 122 may be high (e.g., above 50 volts), the gate-to-source breakdown voltage may be lower (e.g., only 20 volts). The level shifted signal FBN may be a feedback signal to make sure both output power MOSFETs in each pair of power MOSFETS may be shut down before changing states.

Figure 7:
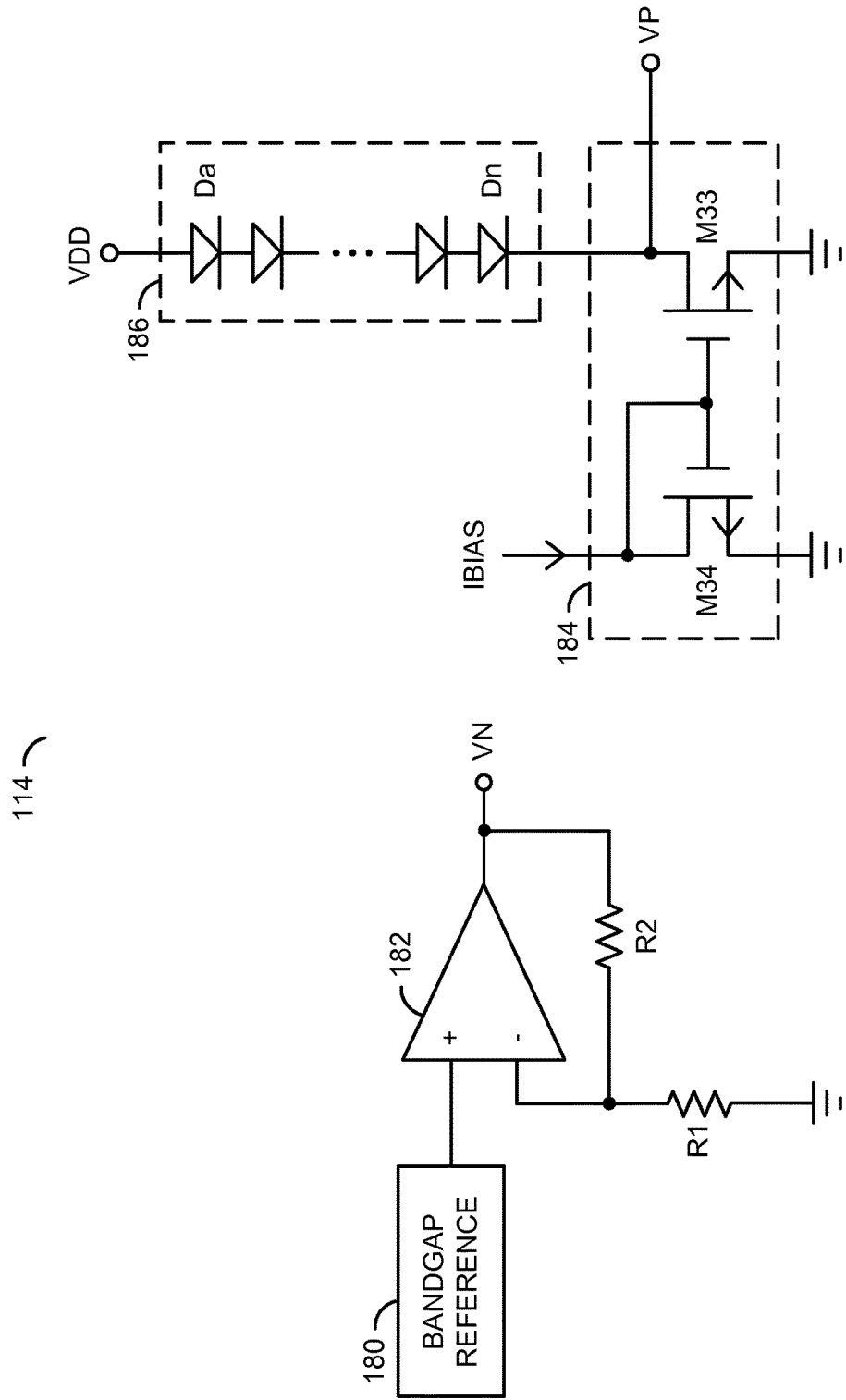
FIG. 7 is a block diagram of a bias circuit.

Referring to FIG. 7, a block diagram of an example implementation of the circuit 114 is shown. The circuit 114 generally comprises a block (or circuit) 180, a block (or circuit) 182, a block (or circuit) 184, a block (or circuit) 186 and multiple devices (or circuits) R1-R2. The circuits 180-186 and the device R1-R2 may be implemented with hardware and/or simulated with software.

The circuit 180 may implement a bandgap reference circuit. The circuit 182 may implement an operational amplifier circuit. The circuit 184 may implement a current mirror circuit. In the example, the circuit 184 generally comprises multiple MOSFETs (e.g., M33 and M34). The circuit 186 may implement a level shifter circuit. The circuits R1 and R2 may implement resistors arranged as a voltage divider circuit.

The circuit 180 may be operational to generate a stable reference voltage for use by the operational amplifier circuit 182. The clamping signal (or voltage) VN may be generated by the operational amplifier circuit 182. The signal VN may be a multiple of a reference voltage generated by the bandgap reference circuit 180. The multiplication factor is generally determined by the values of the resistors R1 and R2. The signal VN may be generated in an intermediate voltage domain (e.g., 5 volts to 20 volts) at an intermediate voltage (e.g., around 15 volts) referenced to (e.g., above) ground. The bandgap reference circuit 180 may be designed to have a slightly upward slope versus temperature.

The clamping signal (or voltage) VP may be generated by a chain of diodes (e.g., Da-Dn) in the circuit 186 and the current mirror circuit 184 formed by the MOSFETs M33 and M34. Current through the diodes Da-Dn may be set by an input current signal (e.g., IBIAS) received by the current mirror circuit 184. The signal VP may be generated in the high voltage domain at a high voltage (e.g., around 15 volts) referenced to (e.g., less than) the power supply signal VDD.

Figure 8:
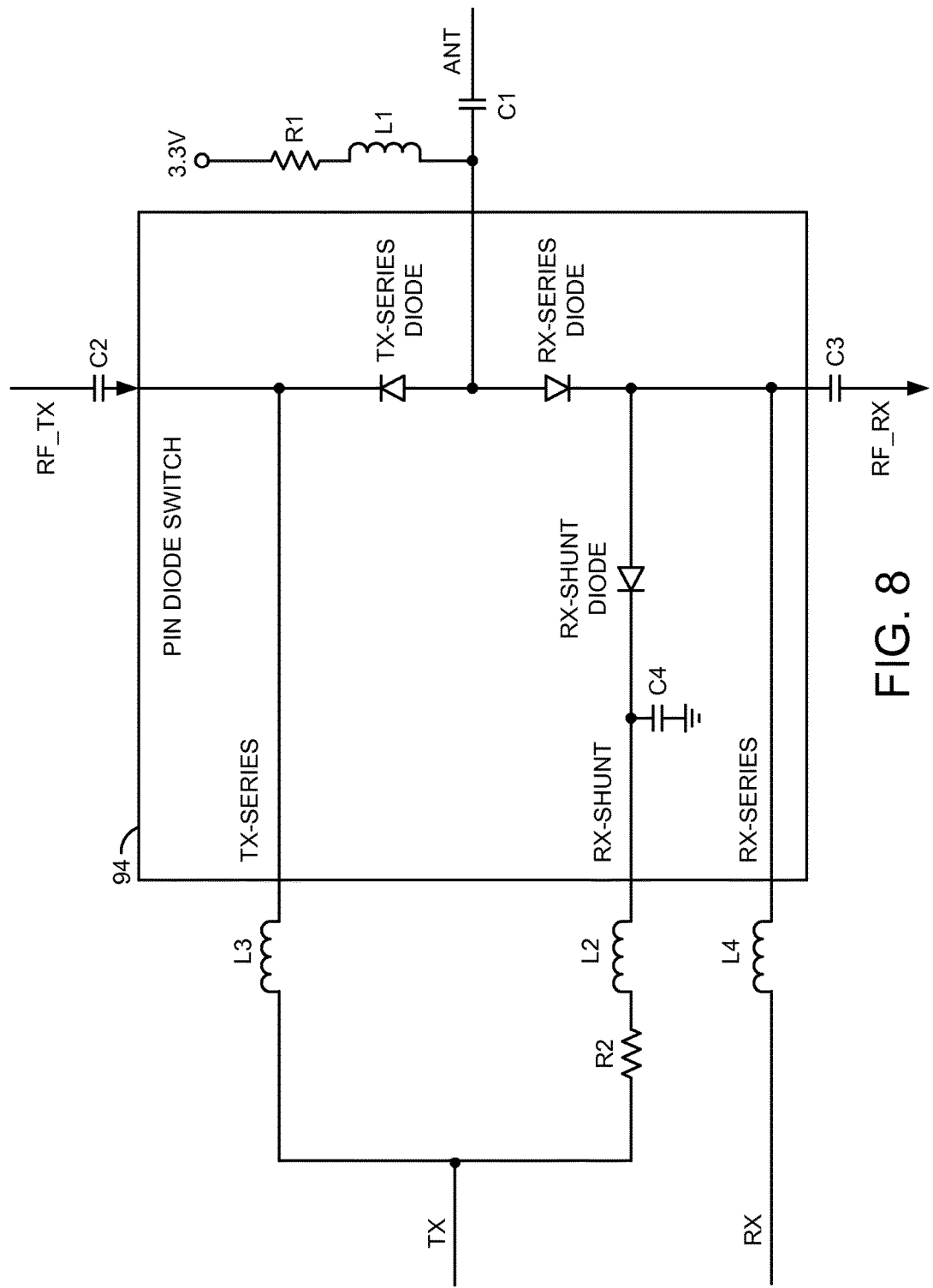
FIG. 8 is a schematic diagram of a diode switch circuit.

Referring to FIG. 8, a schematic diagram of an example common implementation of the circuit 94 is shown. In various embodiments, the circuit 94 may implement a series-shunt single-pole double-throw switch. The circuit 94 generally comprises multiple switching diodes (e.g., TX-SERIES, RX-SERIES and RX-SHUNT) and a capacitor (e.g., C4). Additional resistors (e.g., R1 and R2), additional capacitors (e.g., C1, C2 and C3) and additional inductors (e.g., L1, L2, L3 and L4) may be implemented external to the circuit 94 and coupled to ports of the circuit 94.

The diode TX-SERIES may couple the signal RF_TX with the signal ANT. The diode RX-SERIES may couple the signal RF_RX with the signal ANT. The diode RX-SHUNT may couple the signal RF_RX with the signal TX. A series inductor-resistor set (e.g., L1 and R1) may be connected to the signal ANT to bias the diodes within the circuit 94 to a low (e.g., 3.3 volts) voltage. Another series inductor-resistor set (e.g., L2 and R2) may be inline between an input (or port) RX-SHUNT of the circuit 94 and the circuit 100. The inductor L3 may be in series between an input (or port) TX-SERIES of the circuit 94 and the circuit 100. The inductor L4 may be in series between an input (or port) RX-SERIES of the circuit 94 and the circuit 100. The capacitor C1 may be used as a DC block between the low voltage and the antenna 99. The capacitor C2 may be used as a DC block between the signal RF_TX and the inductor L3/signal TX. The capacitor C3 may be used as a DC block between the signal RF_RX and the inductor L4/signal RX. The capacitor C4 may be connected between the input RX-SHUNT and ground. In embodiments where the circuit 94 implements a series-shunt series-shunt single-pole double-throw switch (e.g., a diode TX-SHUNT is included), and an input (or port) TX-SHUNT may be connected to the input RX-SERIES.

Measurement results of prototype circuits 100 generally show less than 1 milliampere of quiescent current from a 20-volt to 50-volt power supply. A measured switching speed when driving a pair of 120 picofarad capacitors is generally less than 300 nanoseconds.

Embodiments of the present invention generally provide a high voltage PIN diode driver integrated circuit with multiple features. The apparatus may be fully integrated as a single integrated circuit (or chip or die). No external power MOSFETs may be included in the design to achieve the current capability. The apparatus may provide 200 milliamperes or greater sinking current and 100 milliamperes or greater sourcing current to drive a single-pole double-throw PIN diode switch. A fully integrated voltage translator in the apparatus may allow control in a regular logic voltage domain. The control may be compatible to both 3 volt logic and 5 volt logic. A bandgap reference circuit in the apparatus biasing circuit generally provides temperature compensation. The temperature compensation may minimize PIN diode bias current variations over temperature and over the back bias voltage range (e.g., from 20 volts to 50 volts). The apparatus may consume a low quiescent current power consumption (e.g., as low as 1 milliampere) for 50 volt operation. The apparatus may provide fast switching speeds (e.g., less than 300 nanoseconds) to the PIN diode switch. The apparatus may be extended to drive switches of any number of poles and throws. The apparatus may be extended to drive absorptive, as well as reflective switches. By using a higher voltage process, the apparatus may be extended to higher voltages (as long as a process is available).

The functions and structures illustrated in the diagrams of FIGS. 1-8 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example a non-transitory storage media, and may be executed by one or more of the processors. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit configured to translate an input signal in a first voltage domain to generate a complementary pair of first signals in a second voltage domain, wherein (i) said input signal comprises a complementary input signal and (ii) said complementary pair of first signals comprise four first signals;
a second circuit configured to logically switch said first signals to generate a complementary pair of second signals in said second voltage domain, wherein said first signals are logically switched such that both of said second signals are inactive before one of said second signals transitions from inactive to active; and
a third circuit configured to amplify said second signals to generate a complementary pair of output signals in said second voltage domain, wherein each of said output signals has a current capacity to drive one or more of a plurality of diodes in a diode switch circuit.

2. The apparatus according to claim 1, further comprising a fourth circuit configured to generate said input signal in said first voltage domain in response to a control signal, wherein said diodes are PIN diodes and said diode switch circuit is a PIN diode switch circuit.

3. The apparatus according to claim 1, wherein said second voltage domain is at least 20 volts.

4. The apparatus according to claim 1, wherein said current capacity sinks up to 200 milliamperes.

5. The apparatus according to claim 1, wherein said current capacity sources up to 100 milliamperes.

6. The apparatus according to claim 1, wherein said second circuit comprises a first logical gate and a second logical gate (i) cross-coupled to each other, (ii) configured to receive said complementary pair of first signals and (iii) configured to generate half of said complementary pair of second signals.

7. The apparatus according to claim 6, wherein said first logical gate comprises a NAND gate and said second logical gate comprises a NOR gate.

8. The apparatus according to claim 1, wherein said first circuit, said second circuit and said third circuit are implemented in an application specific integrated circuit.

9. A method for driving a plurality of diodes, comprising the steps of:
translating an input signal in a first voltage domain to generate a complementary pair of first signals in a second voltage domain, wherein (i) said input signal comprises a complementary input signal and (ii) said complementary pair of first signals comprise four first signals;
logically switching said first signals to generate a complementary pair of second signals in said second voltage domain, wherein said first signals are logically switched such that both of said second signals are inactive before one of said second signals transitions from inactive to active; and
amplifying said second signals to generate a complementary pair of output signals in said second voltage domain, wherein each of said output signals has a current capacity to drive one or more of said diodes in a diode switch circuit.

10. The method according to claim 9, further comprising the step of:
generating said input signal in said first voltage domain in response to a control signal, wherein said diodes are PIN diodes and said diode switch circuit is a PIN diode switch circuit.

11. The method according to claim 9, wherein said second voltage domain is at least 20 volts.

12. The method according to claim 9, wherein said current capacity sinks up to 200 milliamperes.

13. The method according to claim 9, wherein said current capacity sources up to 100 milliamperes.

14. The method according to claim 9, wherein half of said complementary pair of second signals are generated by a first logical gating function and a second logical gating function (i) cross-coupled to each other and (ii) configured to receive said complementary pair of first signals.

15. The method according to claim 14, wherein said first logical gating function comprises a NAND function and said second logical gating function comprises a NOR function.

16. The method according to claim 9, wherein said complementary pair of second signals comprise four second signals.

17. An apparatus comprising:
means for translating an input signal in a first voltage domain to generate a complementary pair of first signals in a second voltage domain, wherein (i) said input signal comprises a complementary input signal and (ii) said complementary pair of first signals comprise four first signals;

means for logically switching said first signals to generate a complementary pair of second signals in said second voltage domain, wherein said first signals are logically switched such that both of said second signals are inactive before one of said second signals transitions from inactive to active; and means for amplifying said second signals to generate a complementary pair of output signals in said second voltage domain, wherein each of said output signals has a current capacity to drive one or more of a plurality of diodes in a diode switch circuit.

18. The apparatus according to claim 1, wherein said complementary pair of second signals comprise four second signals.

19. The apparatus according to claim 18, wherein said complementary pair of output signals comprises two output signals.

* * * * *